(12) United States Patent
Howder et al.

(10) Patent No.: US 12,167,600 B2
(45) Date of Patent: *Dec. 10, 2024

(54) INTEGRATED ASSEMBLIES, AND METHODS OF FORMING INTEGRATED ASSEMBLIES

(71) Applicant: Lodestar Licensing Group LLC, Evanston, IL (US)

(72) Inventors: Collin Howder, Meridian, ID (US); Gordon A. Haller, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/140,516

(22) Filed: Apr. 27, 2023

(65) Prior Publication Data

US 2023/0284451 A1 Sep. 7, 2023

Related U.S. Application Data

(60) Continuation of application No. 17/731,103, filed on Apr. 27, 2022, now Pat. No. 11,690,226, which is a
(Continued)

(51) Int. Cl.
| | |
|---|---|
| H10B 43/27 | (2023.01) |
| H10B 41/10 | (2023.01) |
| H10B 41/27 | (2023.01) |
| H10B 41/35 | (2023.01) |
| H10B 43/10 | (2023.01) |
| H10B 43/35 | (2023.01) |

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; G11C 16/0483
See application file for complete search history.

(56) References Cited

U.S. PATENT DOCUMENTS

| | | | |
|---|---|---|---|
| 9,741,737 B1 | 8/2017 | Huang et al. | |
| 10,236,301 B1 | 3/2019 | Howder et al. | |

(Continued)

FOREIGN PATENT DOCUMENTS

WO WO 5/2022
PCT/US2020/063821

OTHER PUBLICATIONS

WO PCT/US2020/063821 Search Rep., Mar. 26, 2021, Micron Technology, Inc.

(Continued)

*Primary Examiner* — Allison Bernstein
(74) *Attorney, Agent, or Firm* — Brooks, Cameron & Huebsch, PLLC

(57) ABSTRACT

Some embodiments include an integrated structure having a stack of memory cell levels. A pair of channel-material-pillars extend through the stack. A source structure is under the stack. The source structure includes a portion having an upper region, a lower region, and an intermediate region between the upper and lower regions. The upper and lower regions have a same composition and join to one another at edge locations. The intermediate region has a different composition than the upper and lower regions. The edge locations are directly against the channel material of the channel-material-pillars. Some embodiments include methods of forming an integrated assembly.

14 Claims, 19 Drawing Sheets

Related U.S. Application Data division of application No. 16/723,136, filed on Dec. 20, 2019, now Pat. No. 11,348,939.

(56) References Cited

U.S. PATENT DOCUMENTS

| | | |
|---|---|---|
| 10,784,273 B2 | 9/2020 | Howder et al. |
| 2018/0323213 A1 | 11/2018 | Arai |
| 2018/0366483 A1 | 12/2018 | Choi |
| 2019/0067312 A1 | 2/2019 | Arisumi et al. |
| 2019/0081063 A1 | 3/2019 | Yamanaka |
| 2019/0288000 A1 | 9/2019 | Choi |
| 2020/0328226 A1 | 10/2020 | Park et al. |
| 2021/0066460 A1 | 3/2021 | Haller |

OTHER PUBLICATIONS

WO PCT/US2020/063821 Writ. Opin., Mar. 26, 2021, Micron Technology, Inc.

INTEGRATED ASSEMBLIES, AND METHODS OF FORMING INTEGRATED ASSEMBLIES

RELATED PATENT DATA

This patent resulted from a continuation of U.S. patent application Ser. No. 17/731,103 filed Apr. 27, 2022, which is a divisional of U.S. patent application Ser. No. 16/723,136 filed Dec. 20, 2019, now U.S. Pat. No. 11,348,939, each of which is hereby incorporated by reference herein.

TECHNICAL FIELD

Integrated assemblies (e.g., memory devices configured for NAND). Methods of forming integrated assemblies (e.g., integrated memory devices).

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines 2021 to 202x, and bitlines 2281 to 228M.

The memory array 200 also includes NAND strings 2061 to 206M. Each NAND string includes charge-storage transistors 2081 to 208N. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor 2081 of the corresponding NAND string 2061. The source-select devices 210 are connected to source-select line 214.

The drain of each drain-select device 212 is connected to a bitline (i.e., digit line) 228 at a drain contact. For example, the drain of drain-select device 2121 is connected to the bitline 2281. The source of each drain-select device 212 is connected to the drain of the last charge-storage transistor 208 of the corresponding NAND string 206. For example, the source of drain-select device 2121 is connected to the drain of charge-storage transistor 208x of the corresponding NAND string 2061.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel material pillar, and a region of such pillar may be gatedly coupled with an SGS device. The gatedly coupled portion of the channel material pillar is a portion that overlaps a gate of the SGS device.

It can be desired that at least some of the gatedly coupled portion of the channel material pillar be heavily doped. In some applications it can be desired that the gatedly coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an underlying doped semiconductor material.

It is desired to develop improved methods of achieving desired heavily-doped regions of channel material pillars. It is also desired to develop improved memory devices.

BRIEF DESCRIPTION OF THE DRAWINGS

FIG. 5 is a diagrammatic cross-sectional side view. FIG. 5A is a diagrammatic top-down view along the line 5A-5A of FIG. 5. The cross-sectional side view of FIG. 5 is along the line 5-5 of FIG. 5A.

DETAILED DESCRIPTION OF THE ILLUSTRATED EMBODIMENTS

Some embodiments include integrated structures having a source-structure-portion which includes an upper region, a lower region, and an intermediate region between the upper and lower regions. The upper and lower regions have a same composition and join to one another at edge locations. The intermediate region has a different composition than the upper and lower regions. The edge locations may be directly against channel material of channel-material-pillars. Some embodiments include methods of forming integrated structures. Example embodiments are described with reference to FIGS. 5-16.

Figure 1:
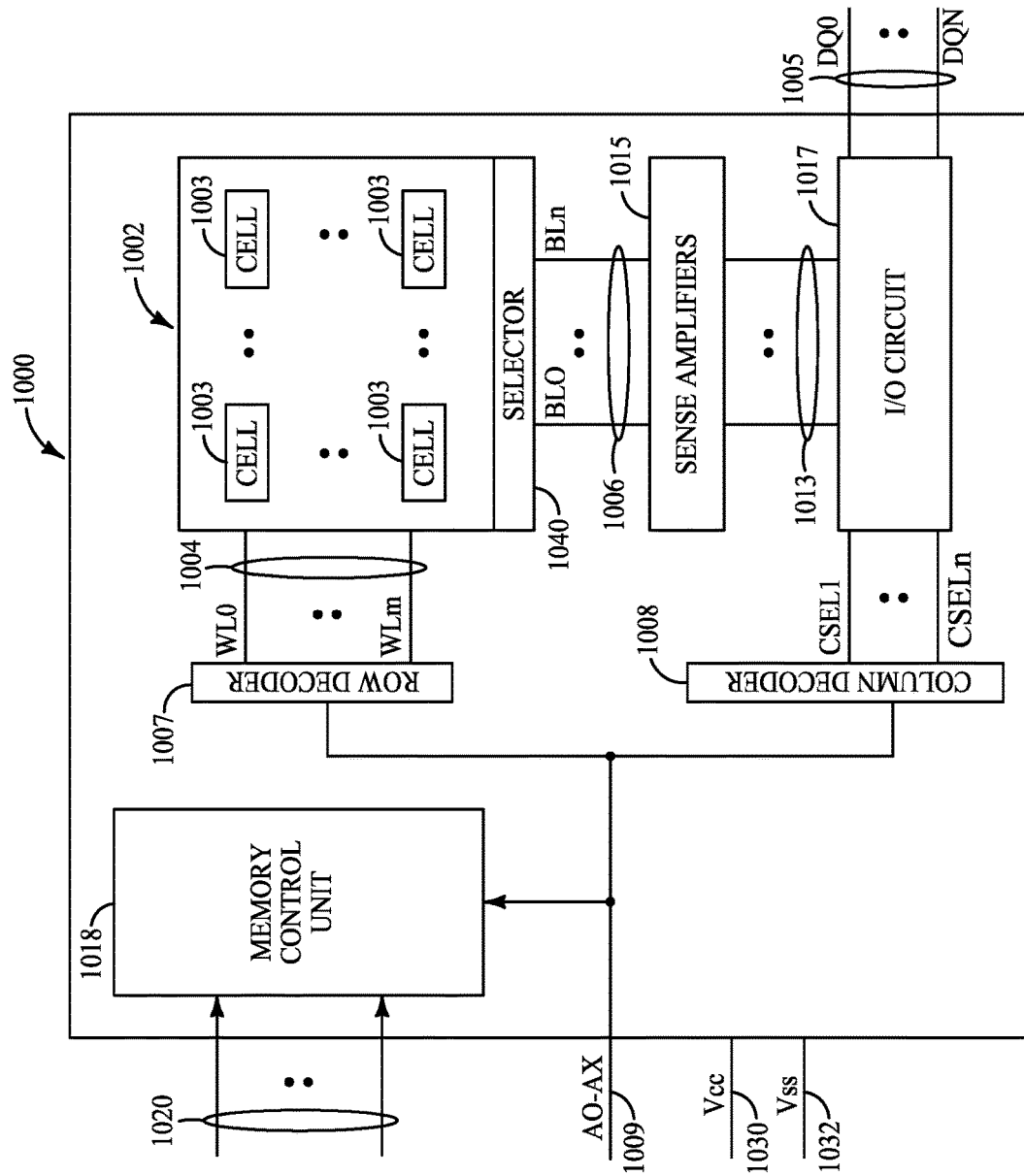
FIG. 1 shows a block diagram of a prior art memory device having a memory array with memory cells.
Figure 2:
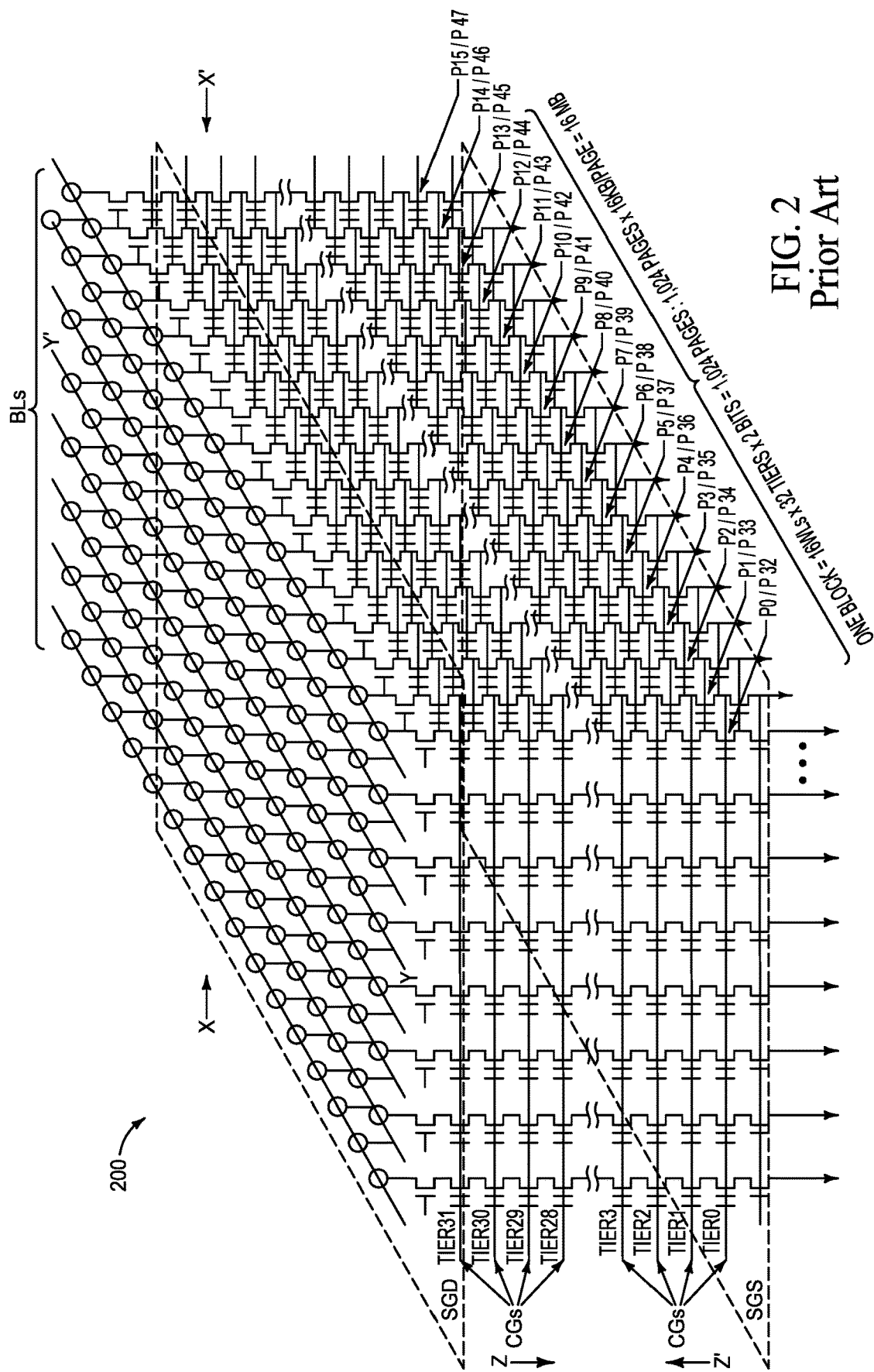
FIG. 2 shows a schematic diagram of the prior art memory device of FIG. 1 in the form of a 3D NAND memory device.
Figure 3:
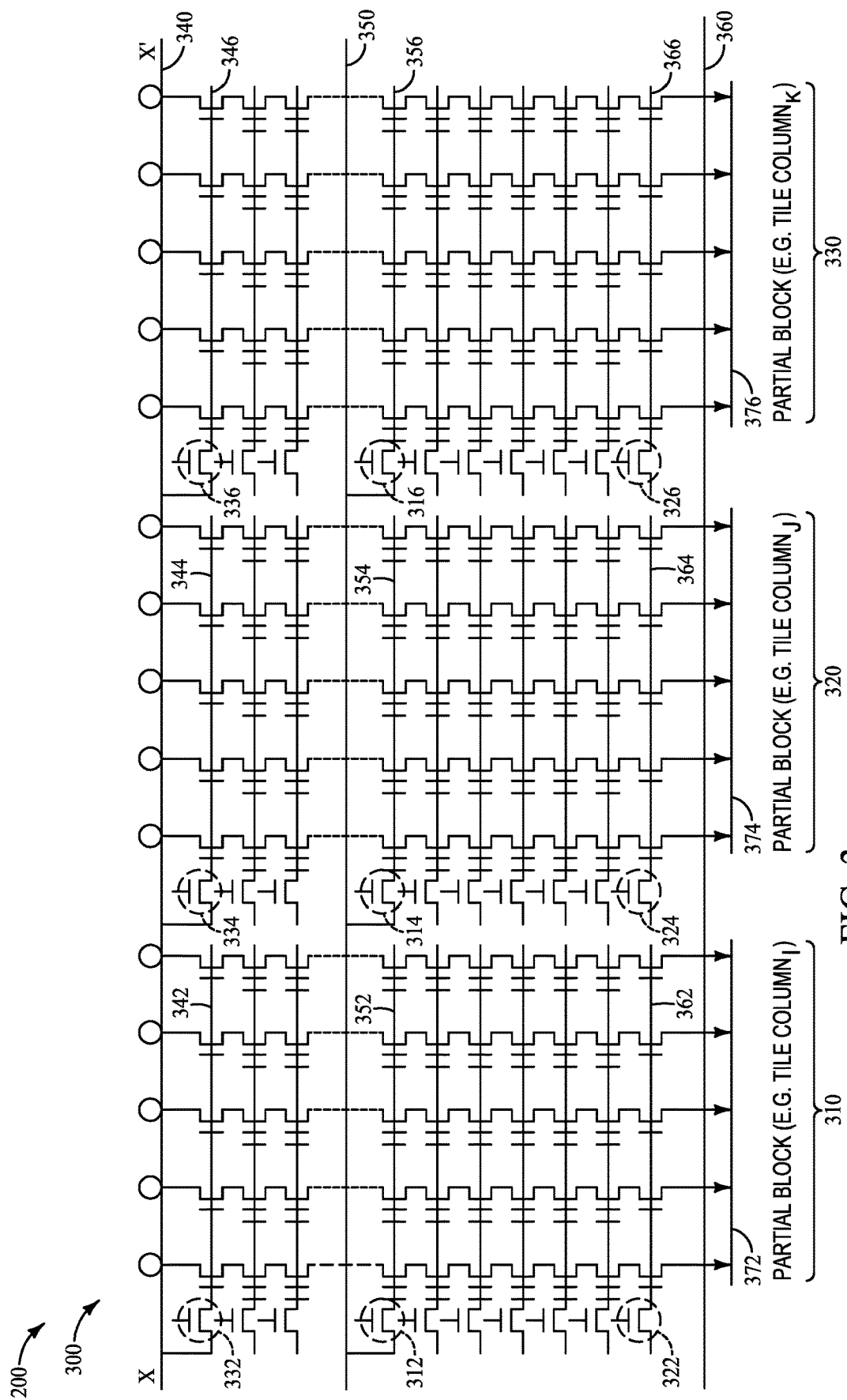
FIG. 3 shows a cross-sectional view of the prior art 3D NAND memory device of FIG. 2 in an X-X' direction.
Figure 4:
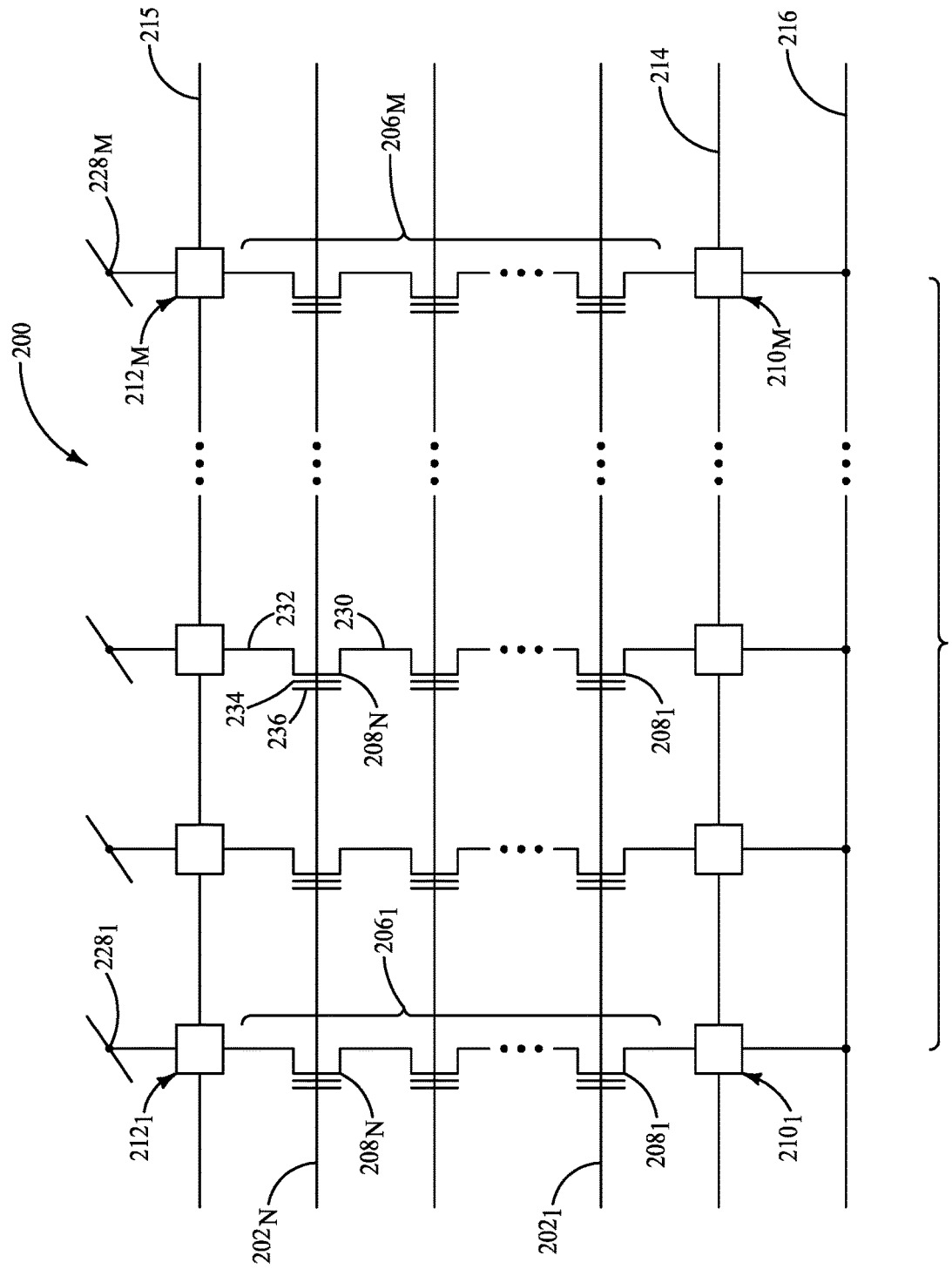
FIG. 4 is a schematic diagram of a prior art NAND memory array.
Figure 5:
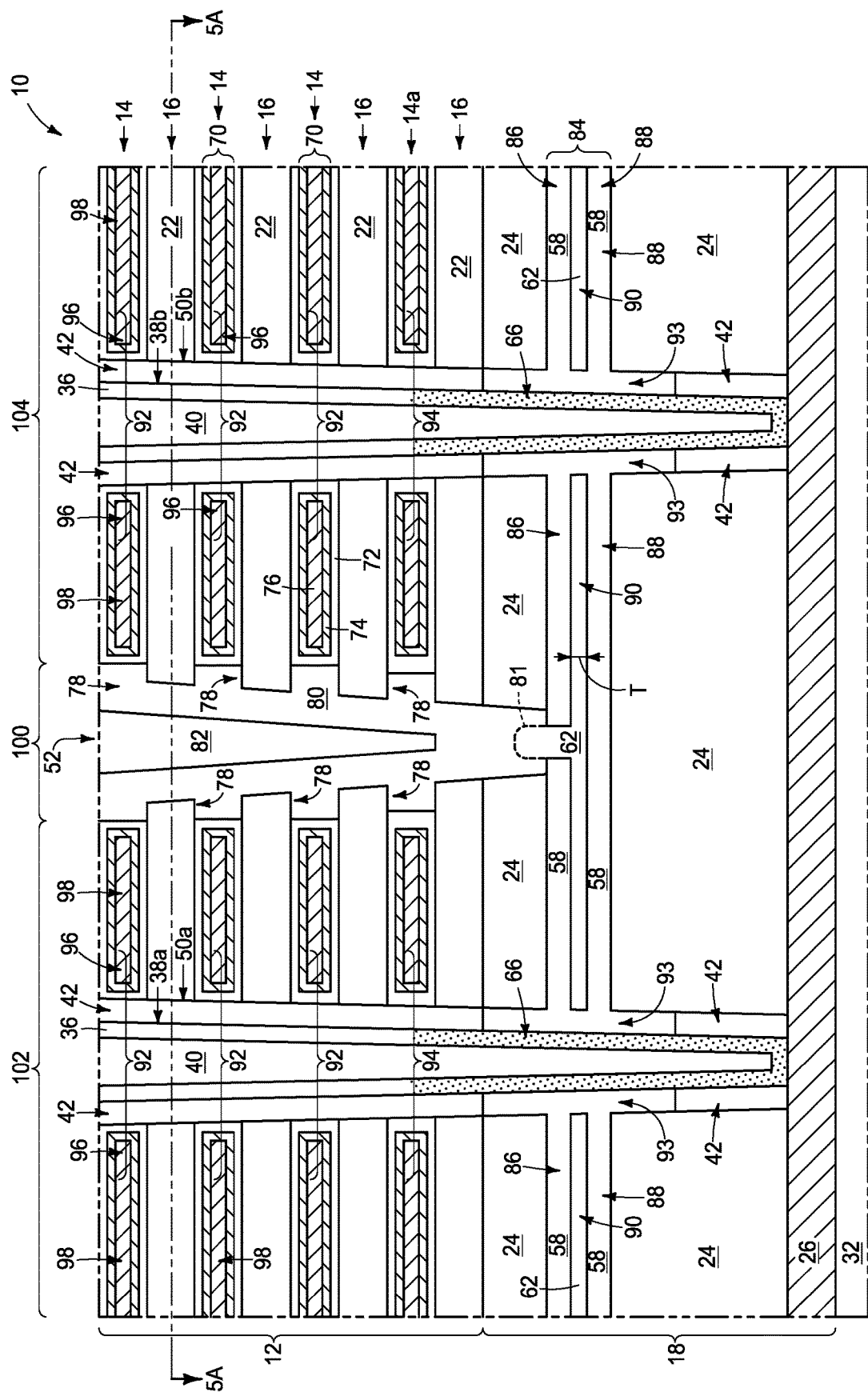
FIGS. 5 and 5A are diagrammatic views of a region of an example memory device (memory array, memory configuration).
Figure 5A:
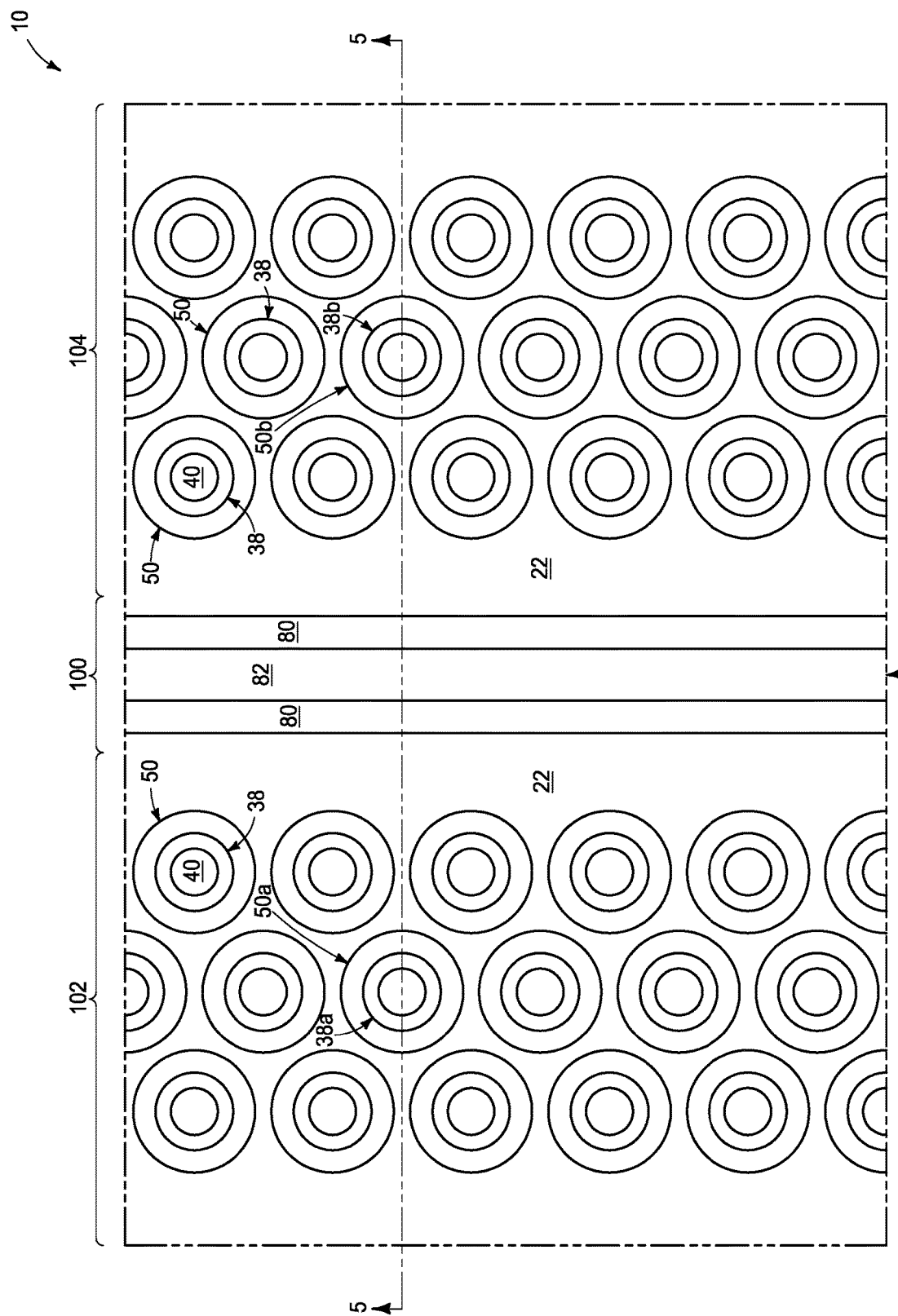

Referring to FIGS. 5 and 5A, an integrated assembly 10 includes a stack 12 of alternating conductive levels 14 and insulative levels 16.

The conductive levels 14 include conductive regions 70. The conductive regions 70 may comprise any suitable composition(s). In the shown embodiment, the conductive regions include a conductive core material 76 (e.g., tungsten), and a conductive liner material 74 (e.g., titanium nitride) which at least partially surrounds the core material.

Dielectric-barrier material 72 extends at least partially around the conductive regions 70. The dielectric-barrier material 72 may comprise any suitable composition(s); and in some embodiments comprises high-k material (e.g., AlO, where the chemical formula indicates primary constituents rather than a specific stoichiometry). The term "high-k" means a dielectric constant greater than that of silicon dioxide.

The insulative levels 16 comprise insulative material 22. The insulative material 22 may comprise any suitable composition(s); and in some embodiments may comprise, consist essentially of, or consist of silicon dioxide. In some embodiments, the levels 16 may be referred to as intervening levels provided between the conductive levels 14.

A source structure 18 is under the stack 12. The source structure 18 comprises materials 24 and 26. The material 24 may comprise conductively-doped semiconductor material (e.g., conductively-doped silicon), and the material 26 may be a metal-containing material (e.g., WSi, where the chemical formula indicates primary constituents rather than a specific stoichiometry).

The source structure 18 also includes a portion 84 having an upper region 86, a lower region 88, and intermediate region 90 between the upper and lower regions.

The upper and lower regions 86 and 88 comprise a same composition 58 as one another, and join to one another at edge locations 93. The intermediate region 90 comprises a composition 62 which is a different from the composition 58.

In some embodiments, the composition 58 may comprise conductively-doped semiconductor material (e.g., conductively-doped silicon). In such embodiments, the composition 58 may be the same as the composition 24, or may be different than the composition 24.

The composition 62 may be semiconductive, insulative, or conductive. In some embodiments, the composition 62 includes semiconductor material (e.g., silicon, germanium, etc.). In some embodiments, the composition 62 includes one or more of amorphous carbon, silicon dioxide and silicon nitride. In some embodiments, the composition 62 includes metal (e.g., tungsten, titanium, etc.) and/or metal-containing compositions (e.g., metal carbide, metal nitride, metal silicide, etc.).

The intermediate region 90 may have any suitable vertical thickness T, and in some embodiments such vertical thickness may be less than or equal to about 30 nanometers (nm) or less than or equal to about 10 nm. In some embodiments, the vertical thickness T may be within a range of from about 5 nm to about 30 nm.

The source structure 18 may be analogous to the source structures 216 described in the "Background" section. The source structure may be coupled with control circuitry (e.g., CMOS). The control circuitry may be under the source structure 18 or may be in any other suitable location. A conductive material of the source structure 18 may be coupled with the control circuitry (e.g. CMOS) at any suitable process stage.

The source structure is shown to be supported by an insulative material 32. The insulative material 32 may comprise any suitable composition(s); including for example, one or more of silicon dioxide, silicon nitride, etc. The insulative material 32 may be supported by a semiconductor substrate (base). Such substrate is not shown in FIG. 5 to simplify the drawing.

Pillars 50 extend through the stack 12, through the material 24 of the source structure 18, and to an upper surface of the metal-containing material 26 within the source structure 18. The pillars 50 along the cross-section of FIG. 5 are labeled as 50a and 50b so that they may be distinguished relative to one another. The pillars 50a and 50b may be referred to as first and second pillars, respectively.

The pillars 50 include channel-material 36, cell materials within a region 42 adjacent the channel material, and dielectric material 40. In some embodiments, the channel material 36 may be considered to be configured as channel-material-pillars (or channel-material-cylinders) 38 which are comprised by the pillars 50. The channel-material-pillars 38 along the cross-section of FIG. 5 are labeled as 38a and 38b so that they may be distinguished relative to one another. The channel-material-cylinders 38a and 38b may be referred to as first and second channel-material-cylinders, respectively.

The memory cell materials within the regions 42 may comprise tunneling material, charge-trapping material and charge-blocking material, as described in more detail below with reference to FIGS. 7 and 7A.

Doped regions 66 (indicated by stippling) are within lower regions of the channel-material-cylinders 38a and 38b. The edge locations 93 described above are directly against portions of the doped regions 66 of the channel-material-cylinders 38.

The assembly 10 of FIG. 5 is shown as a memory device comprising memory cells 92 and source-select devices (SGS devices) 94. A lowermost of the conductive levels 14 is labeled 14a, and the doped region 66 extends to the conductive level 14a. The conductive level 14a comprises the SGS devices 94. In the shown embodiment, the dopant (indicated by stippling) extends partially across the level 14a to achieve the desired balance between non-leaky "OFF" characteristics for the SGS devices and leaky GIDL characteristics for the SGS devices. Although only one of the conductive levels is shown to be incorporated into the source-select devices, in other embodiments multiple conductive levels may be incorporated into the source-select devices. The conductive levels may be electrically coupled with one another (ganged) to be together incorporated into long-channel source-select devices. If multiple of the conductive levels are incorporated into the source-select devices, the out-diffused dopant may extend upwardly across two or more of the conductive levels 14 which are incorporated into the source-select devices.

The memory cells 92 (e.g., NAND memory cells) are vertically stacked one atop another. The memory cells 92 are along the first levels 14. Each of the memory cells 92 comprises a region of the semiconductor material (channel material) 36, and comprises regions (control gate regions) 96 of the conductive levels 14. The regions of the conductive levels which are not comprised by the memory cells 92 may be considered to be wordline regions (or routing regions) 98 which couple the control gate regions with driver circuitry and/or with other suitable circuitry. The memory cells 92 also comprise the cell materials (e.g., the tunneling material, charge-storage material, dielectric-barrier material and charge-blocking material) within the regions 42.

In some embodiments, the conductive levels 14 associated with the memory cells 92 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

An opening (slit, trench) 52 extends through the conductive levels 14, and an insulative panel 100 is provided within such opening. The panel 100 may extend in and out of the page relative to the cross-sectional view of FIG. 5, as indicated in the top-down view of FIG. 5A.

In some embodiments, the pillars 50 may be considered to be representative of a large number of substantially identical channel material pillars extending across the memory device 10; with the term "substantially identical" meaning identical to within reasonable tolerances of fabrication and measurement. FIG. 5A shows the pillars 50 arranged within a matrix (with the pillars 50 being hexagonally-packed in the illustrated embodiment), and shows the slit 52 (and the panel 100 therein) extending through the matrix of the channel material pillars. In some embodiments, the slit 52 (and the panel 100 therein) may divide the pillars between a first block region 102 and a second block region 104. Accordingly, the memory cells 92 on one side of the slit 52 may be considered to be within the first block region 102, and the memory cells 92 on the other side of the slit 52 may be considered to be within a second block region 104. The block regions 102 and 104 may be analogous to the blocks (or sub-blocks) described above in the "Background" section of this disclosure.

The integrated assembly 10 of FIGS. 5 and 5A may be considered to correspond to a memory device, or memory array, comprising the memory cells 92. Such integrated assembly may be formed with any suitable processing. Example processing is described with reference to FIGS. 6-16.

Figure 6:
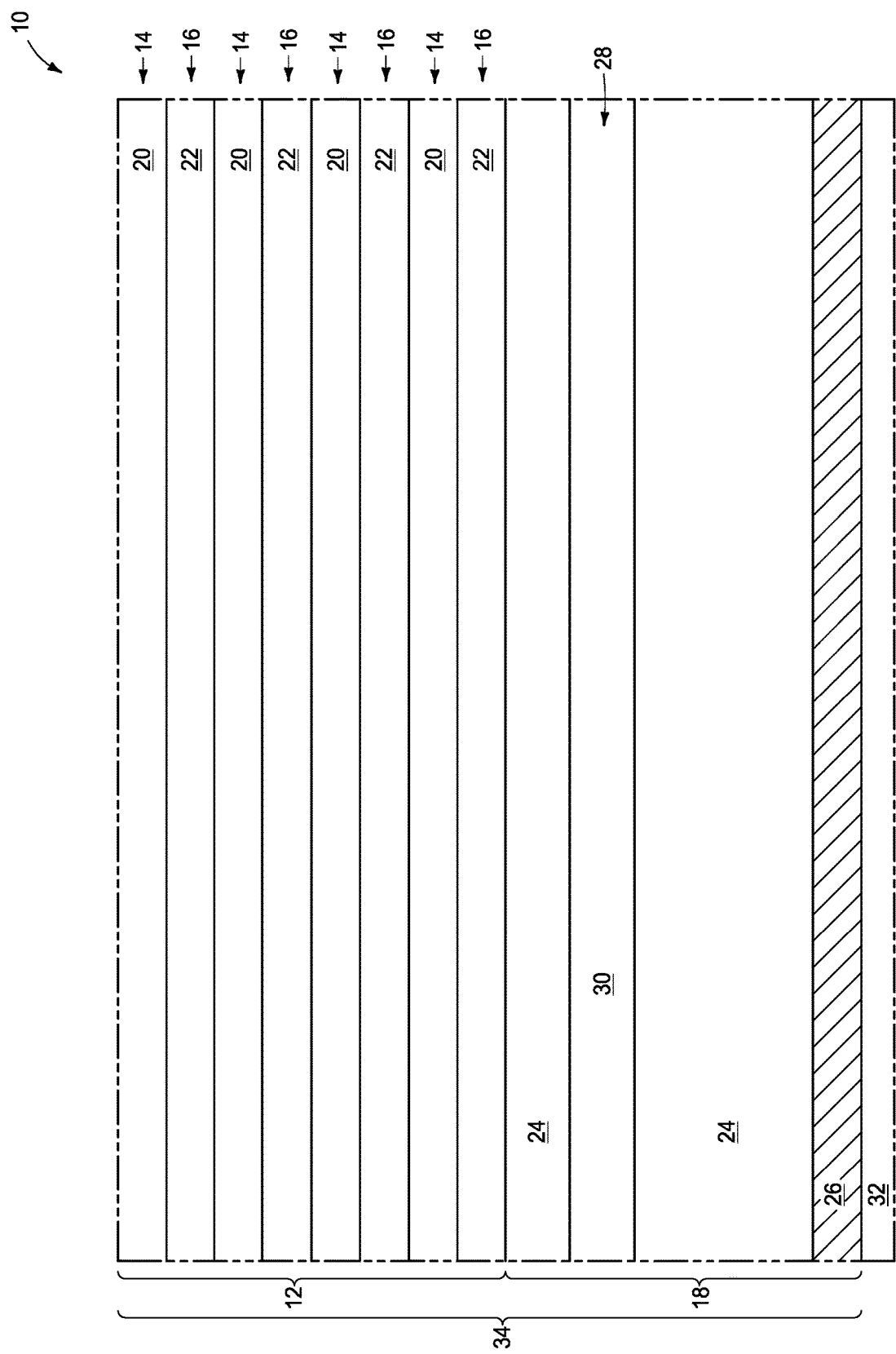
FIG. 6 is a diagrammatic cross-sectional side view of an example integrated assembly at an example process stage of an example embodiment method for forming an example memory device.

Referring to FIG. 6, the integrated assembly 10 is shown at an initial process stage. The assembly 10 includes a preliminary stack 12 of first and second levels 14 and 16 over a preliminary source structure 18.

The first levels 14 comprise a material 20, and the second levels 16 comprise a material 22. The materials 20 and 22 may comprise any suitable compositions. In some embodiments, the material 20 may comprise, consist essentially of, or consist of silicon nitride; and the material 22 may comprise, consist essentially of, or consist of silicon dioxide. The material 22 of FIG. 6 may be identical to that described above with reference to FIG. 5.

The preliminary source structure 18 includes the semiconductor material 24 over the metal-containing material 26, and includes a scam 28 extending laterally within the semiconductor material 24. The seam 28 comprises sacrificial material 30, and may be referred to as a sacrificial-material-scam.

The semiconductor material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, in some embodiments the semiconductor material 24 may comprise conductively-doped silicon (e.g., n-type silicon). The silicon may be in any suitable crystalline form or combination of crystalline forms (e.g., monocrystalline, polycrystalline, amorphous).

The metal-containing material 26 may comprise any suitable metal-containing composition(s); such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the metal-containing material 26 may comprise, consist essentially of, or consist of WSi, where the chemical formula indicates primary constituents rather than a specific stoichiometry. The WSi may be alternatively referred to as $WSi_x$, where x is a number greater than zero.

The sacrificial material 30 is a material which can be selectively removed relative to the semiconductor material 24. For purposes of interpreting this disclosure and the claims follow, a material is considered to be selectively removable relative to another material if the material may be etched faster than the other material. In some embodiments, the sacrificial material 30 may comprise, consist essentially of, or consist of one or more metal nitrides (e.g., titanium nitride, tantalum nitride, tungsten nitride, etc.). For instance the sacrificial material 30 may comprise TiN, where the chemical formula indicates primary constituents rather than a specific stoichiometry.

The metal-containing material 26 is supported by the insulative material 32. The insulative material 32 may comprise any suitable composition(s); such as, for example, one or more of silicon dioxide, silicon nitride, aluminum oxide, etc.

The insulative material 32 may be supported by a base (not shown). The base may comprise semiconductor material; and may, for example, comprise, consist essentially of, or consist of monocrystalline silicon (Si). The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the stack 12 and source structure 18 of FIG. 6 may be together considered to be a construction 34.

Figure 7:
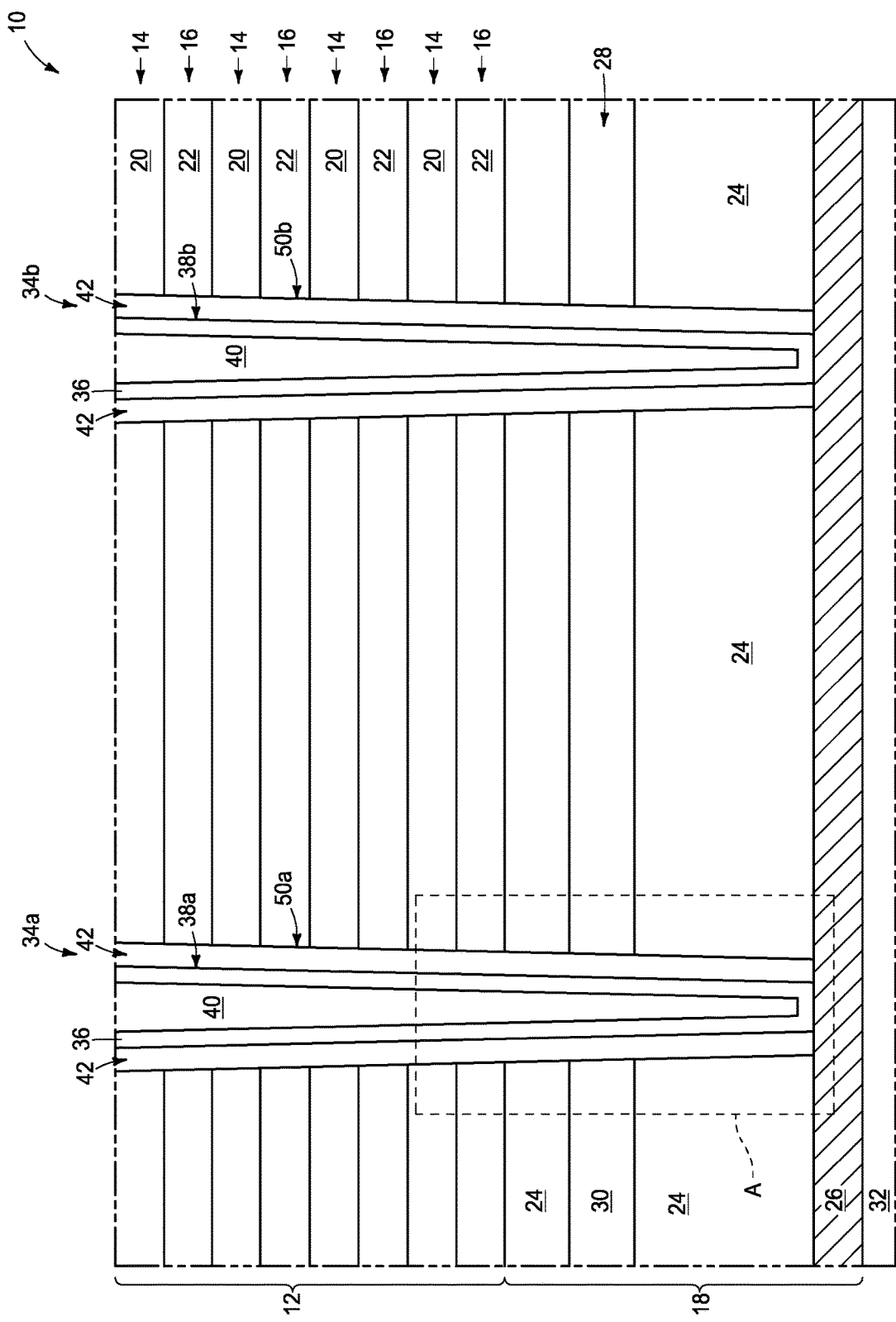
FIG. 7 is a diagrammatic cross-sectional side view of the example integrated assembly of FIG. 6 at an example process stage subsequent to that of FIG. 6.
Figure 7A:
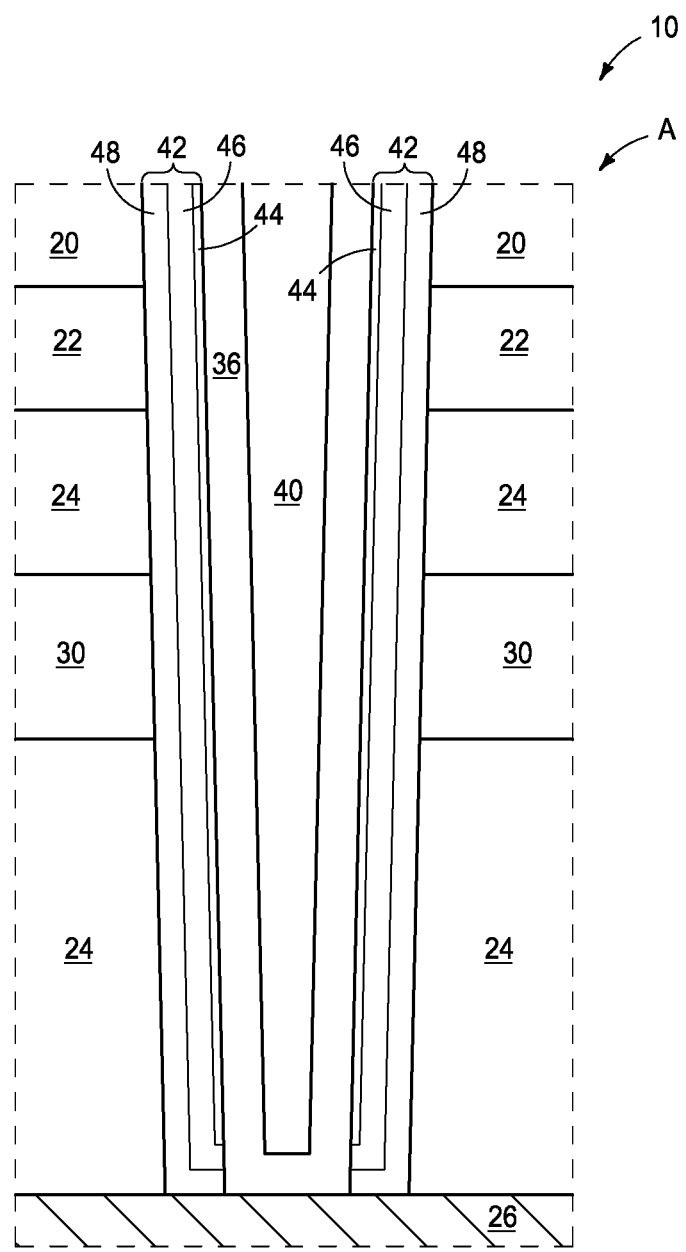
FIG. 7A is an enlarged view of the region "A" of FIG. 7.

Referring to FIG. 7, openings 34 are formed to extend through the stack 12, through the semiconductor material 24 and seam 28, and to the metal-containing material 26. The openings 34 of FIG. 7 may be referred to as first and second openings 34a and 34b to distinguish them from one another. The semiconductor material (channel material) 36 is formed within the openings 34. The semiconductor material 36 forms the channel-material-pillars (channel-material-cylinders) 38 within the openings 34. The illustrated channel-material-cylinders 38 of FIG. 7 may be referred to as first and second channel-material-cylinders 38a and 38b to distinguish them from one another.

The semiconductor material 36 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 36 may comprise, consist essentially of, or consist of appropriately-doped silicon.

In the illustrated embodiment, the channel-material-pillars 36 are annular rings (as shown in the top-down view of FIG. 5A), with such annular rings surrounding an insulative material 40. Such configuration of the channel-material-pillars may be considered to correspond to a "hollow" channel configuration, with the insulative material 40 being provided within the hollows of the channel material pillars. In other embodiments, the channel-material-pillars (channel-material-cylinders) may be configured as solid pillars (cylinders).

The channel-material-pillars 36 are spaced from the materials 20 and 22 of the stack 12 by intervening regions 42. The regions 42 comprise one or more cell materials (memory cell materials), with such cell materials being formed within the openings 34 prior to the channel material 36. The cell materials of the regions 42 may comprise tunneling material 44, charge-storage material 46 and charge-blocking material 48, as shown in FIG. 7A relative to an enlarged view of a region "A" of FIG. 7.

The tunneling material 44 may comprise any suitable composition(s); and in some embodiments may comprise one or more of silicon dioxide, aluminum oxide, hafnium oxide, zirconium oxide, etc.

The charge-storage material 46 may comprise any suitable composition(s); and in some embodiments may comprise charge-trapping material (e.g., one or more of silicon nitride, silicon oxynitride, conductive nanodots, etc.).

The charge-blocking material 48 may comprise any suitable composition(s); and in some embodiments may comprise one or more of silicon dioxide, silicon oxynitride, aluminum oxide, hafnium oxide, zirconium oxide, etc.

The materials 36, 44, 46 and 48 may be together considered to form the pillars 50, with the channel-material-pillars 38 being included within such pillars 50. The illustrated pillars 50 of FIG. 7 may be referred to as first and second pillars 50a and 50b, respectively, to distinguish them from one another.

Figure 8:
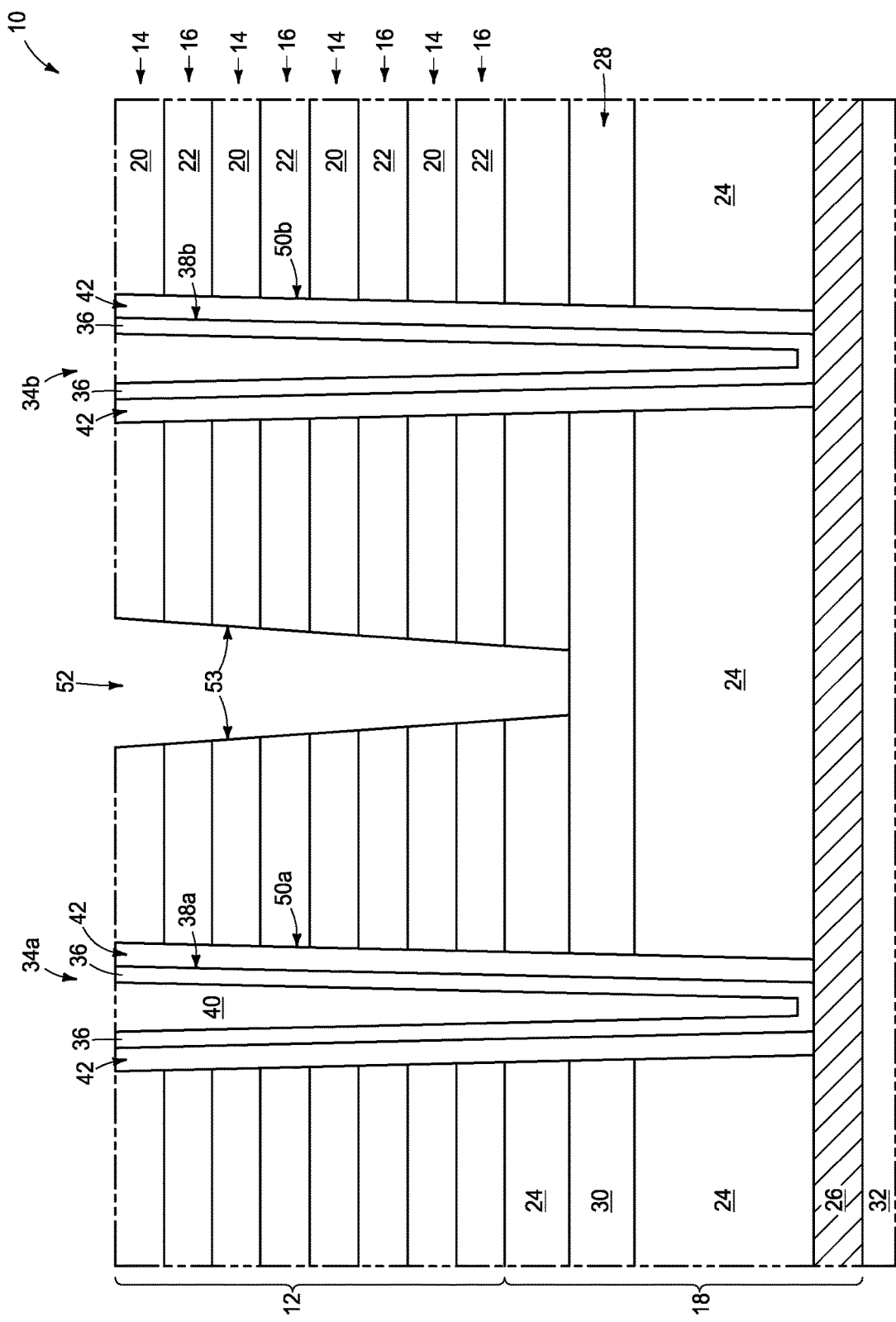
FIG. 8 is a diagrammatic cross-sectional side view of the example integrated assembly of FIG. 6 at an example process stage subsequent to that of FIG. 7.

Referring to FIG. 8, a third opening 52 is formed between the first and second openings 34a and 34b. The third opening 52 corresponds to the slit (trench) described above with reference to FIG. 5. The third opening 52 passes through the stack 12 and to the sacrificial-material-seam 28. The opening 52 may or may not penetrate the sacrificial material 30 of the seam 28. In some embodiments the openings 34 are cylindrical openings and the opening 52 is a trench (slit) which extends in and out of the page relative to the cross-section of FIG. 8, as may be understood with reference to FIG. 5A.

The opening 52 has sidewall surfaces 53 which extend along the materials 20 and 22 of the stack 12. In the shown embodiment, the sidewall surfaces 53 are tapered. In other embodiments, the sidewall surfaces 53 may be substantially vertically straight; with the term "substantially vertically straight" meaning vertically straight to within reasonable tolerances of fabrication and measurement.

Figure 9:
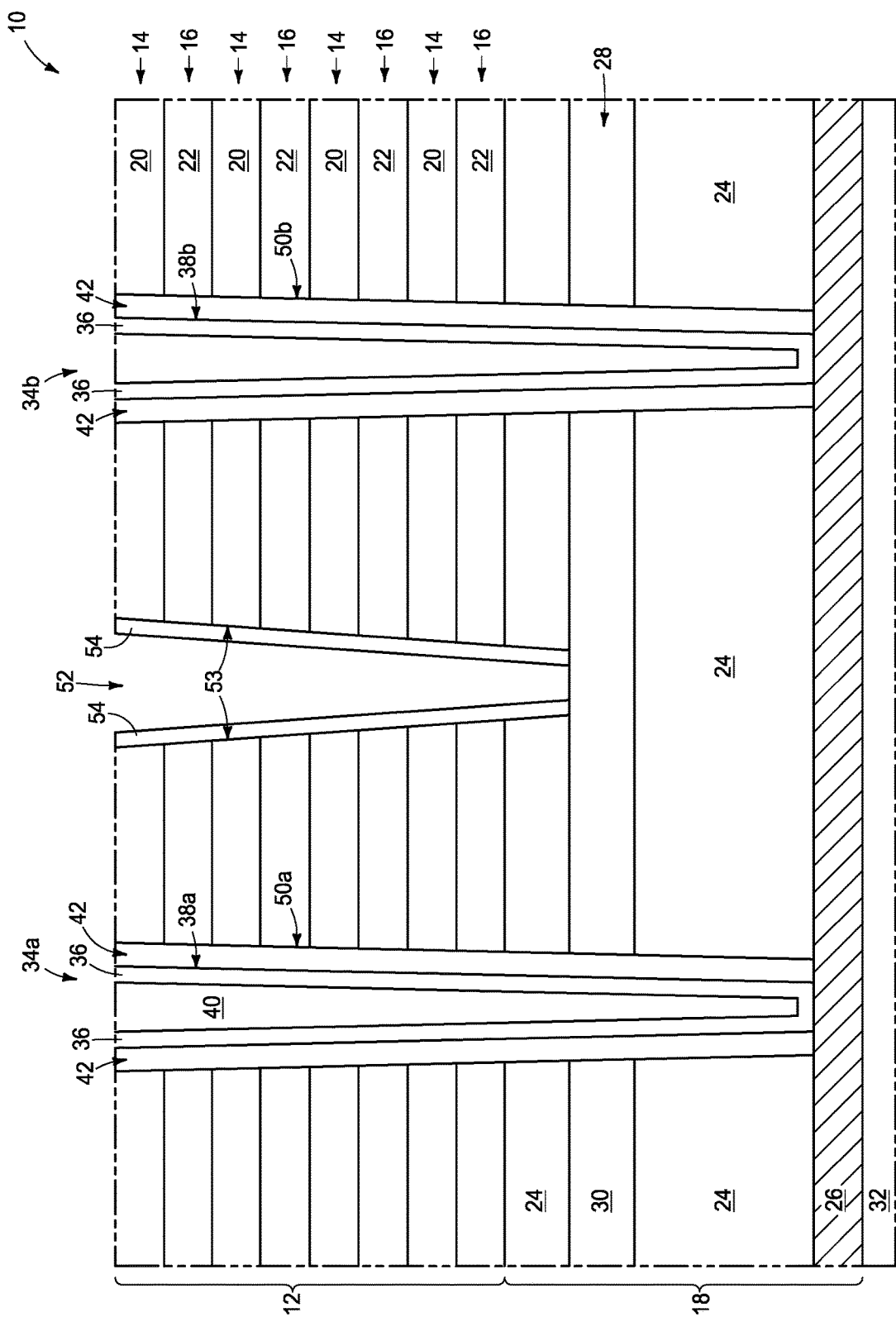
FIG. 9 is a diagrammatic cross-sectional side view of the example integrated assembly of FIG. 6 at an example process stage subsequent to that of FIG. 8.

Referring to FIG. 9, protective material 54 is formed along the sidewall surfaces 53 of the opening 52. In some embodiments, the protective material 54 may be considered to line the sidewall surfaces 53.

The protective material 54 may comprise any suitable composition(s). In some embodiments, the protective material 54 may comprise, consist essentially of, or consist of silicon; and specifically may comprise silicon which is effectively undoped (e.g., comprising an intrinsic dopant concentration, and in some embodiments comprising a dopant concentration of less than or equal to about $10^{16}$ atoms/$cm^3$).

Figure 10:
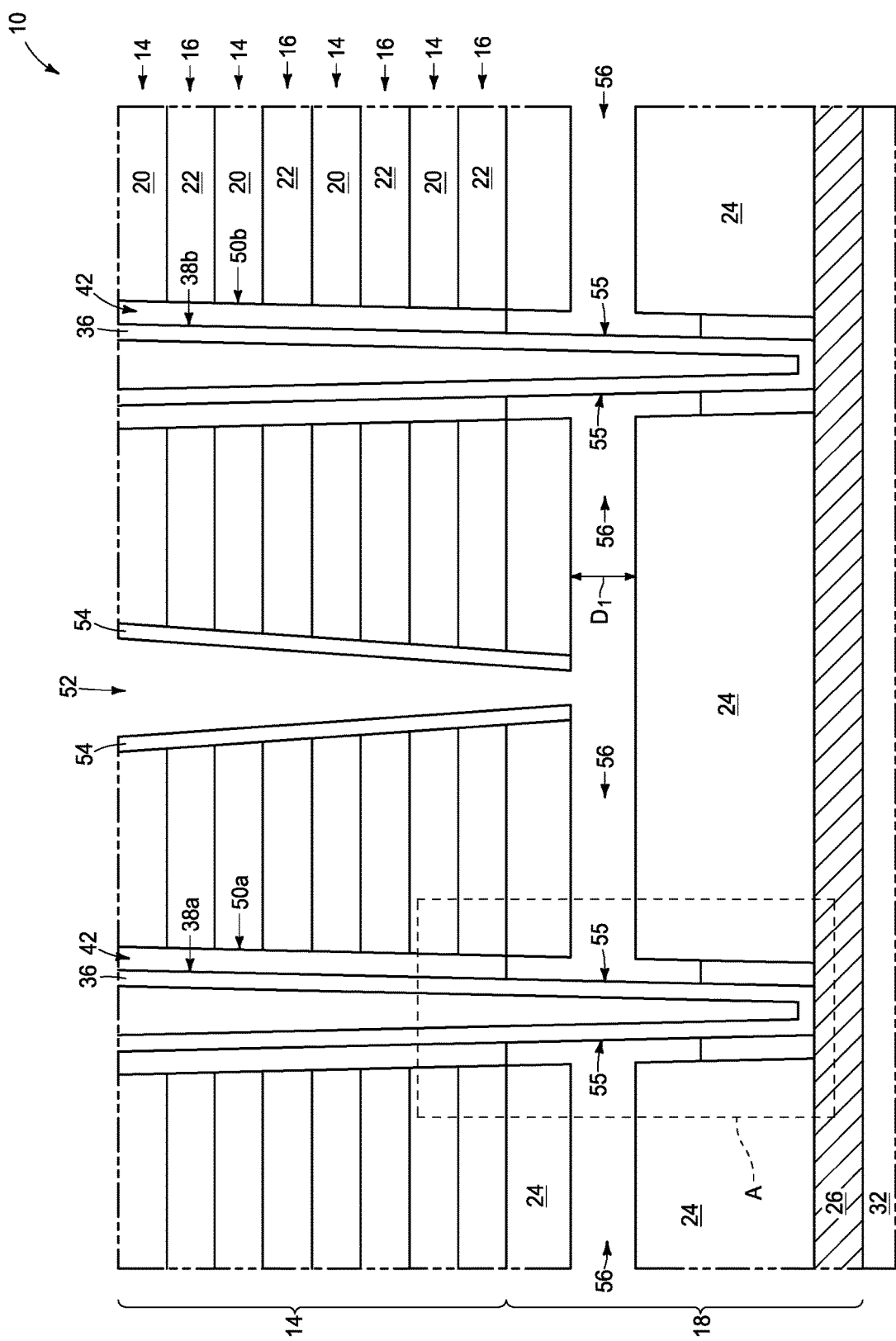
FIG. 10 is a diagrammatic cross-sectional side view of the example integrated assembly of FIG. 6 at an example process stage subsequent to that of FIG. 9.
Figure 10A:
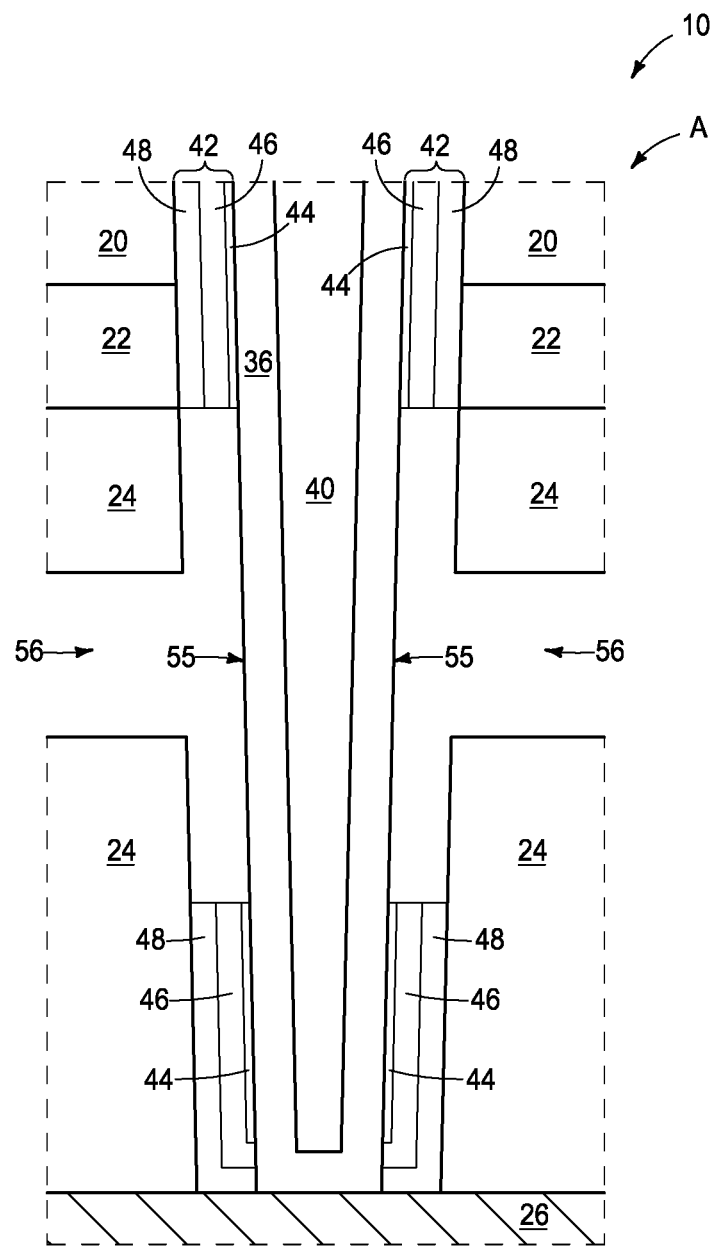
FIG. 10A is an enlarged view of the region "A" of FIG. 10.

Referring to FIG. 10, the sacrificial material 30 of the seam 28 (FIG. 9) is selectively removed relative to the semiconductor material 24, and relative to the protective material 54. Such forms conduits 56. The conduits 56 are extended through the through the cell materials 44, 46 and 48 within the regions 42 (as shown in FIG. 10A) to expose sidewall surfaces 55 of the semiconductor material (channel material) 36. Accordingly, the conduits 56 are extended to the first and second channel-material-cylinders 38a and 38b of the first and second pillars 50a and 50b.

In some embodiments, the conduits 56 may have vertical dimensions D1 within a range of from about 10 nanometers (nm) to about 50 nm.

Figure 11:
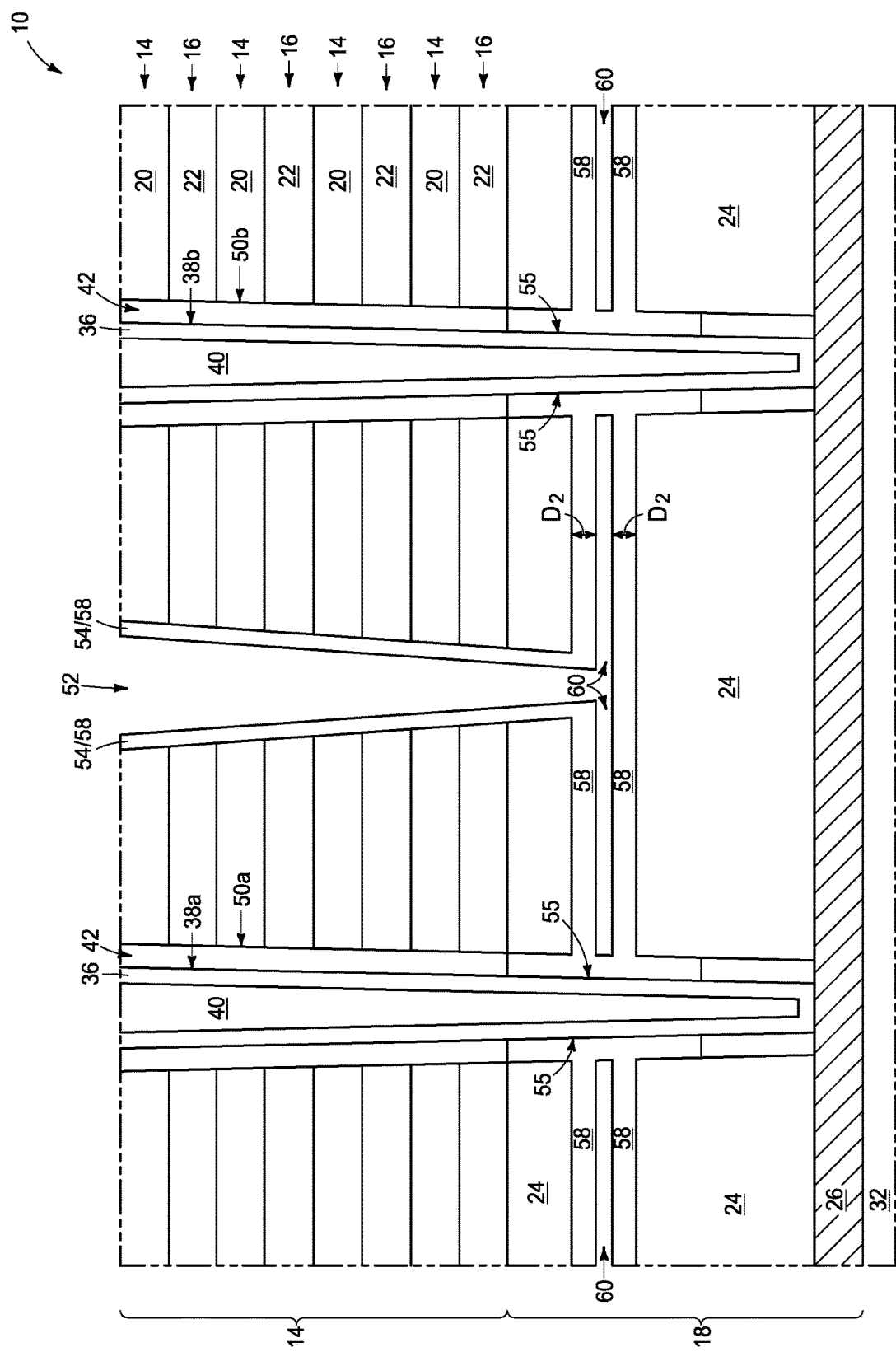
FIG. 11 is a diagrammatic cross-sectional side view of the example integrated assembly of FIG. 6 at an example process stage subsequent to that of FIG. 10.

Referring to FIG. 11, the conductively-doped semiconductor material 58 is formed within the conduits 56 (FIG. 10) to line the conduits (i.e., to partially fill the conduits). The liner of the conductively-doped semiconductor material 58 within the conduits 56 may have a vertical thickness D2 within a range of from about 5 nm to about 20 nm. A void 60 is within the partially-filled conduit, with such void being open to (i.e., being continuous with) the third opening 52.

The semiconductor material 58 may be referred to as a second semiconductor material to distinguish it from the first semiconductor material 24.

The semiconductor material 58 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 58 may comprise silicon which is heavily doped (e.g., doped to a concentration of at least about $10^{21}$ atoms/cm$^3$) with n-type dopant (e.g., phosphorus).

The conductively-doped semiconductor material 58 is directly against the first and second channel-material-cylinders 38a and 38b. In some embodiments, it is found that it can be difficult to uniformly fill the conduits 56 with semiconductor material 58 due to the semiconductor material 58 prematurely pinching off the conduits. Generally, semiconductor material deposits as a relatively rough material, and it can be difficult to uniformly fill the conduits 56 during deposition of such rough material. The partial fill of the conduits disclosed herein may enable the material 58 to entirely fill regions along the surfaces 55 of the channel-material-cylinders 38a and 38b without the premature pinch-off of the conduits.

The material 58 is adjacent the material 54 along the sidewalls of the slit 52. In the shown embodiment, the materials 54 and 58 merge to form a material 54/58. In other embodiments, the material 58 may remain discrete from the material 54 so that the illustrated material 54/58 is actually a laminate of materials 54 and 58.

Figure 12:
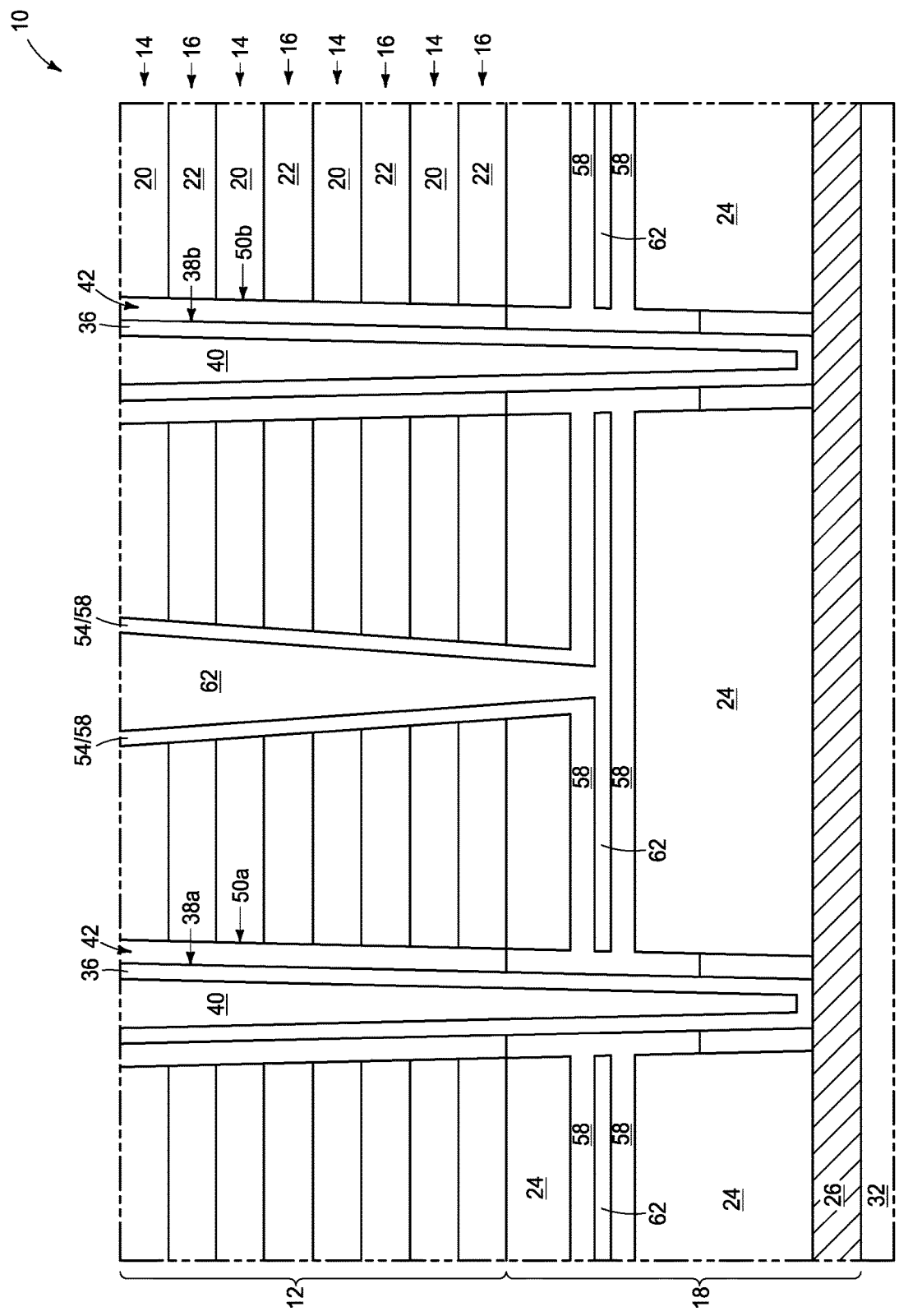
FIG. 12 is a diagrammatic cross-sectional side view of the example integrated assembly of FIG. 6 at an example process stage subsequent to that of FIG. 11.

Referring to FIG. 12, the opening 52 and voids 60 (FIG. 11) are filled with the material 62. In some embodiments, the material 62 may be referred to as a fill material. In some embodiments, the material 62 may be referred to as a third material to distinguish it from the first and second materials 20 and 22 of the stack 12.

The material 62 may comprise any suitable composition(s); and in some embodiments may include semiconductive material, insulative material and/or conductive material.

In some example embodiments, the material 62 may comprise, consist essentially of, or consist of silicon dioxide; and may be formed as a spin-on dielectric (SOD) or a spin-on glass (SOG). Additionally, or alternatively, at least some of the silicon dioxide of the material 62 may be formed by atomic layer deposition (ALD) to ensure that the material 62 entirely fills the voids 60 (FIG. 11). Although the material 62 is shown entirely filling the voids 60 (which may be preferred in some applications), it is to be understood that some embodiments will have regions of the voids 60 remaining after the formation of the material 62 (i.e., the material 62 may not entirely fill the voids 60).

In some example embodiments, the material 62 may comprise, consist essentially of, or consist of carbon (e.g., amorphous carbon).

In some example embodiments, the material 62 may comprise, consist essentially of, or consist of metal (e.g., tungsten, titanium, etc.) and/or metal-containing compositions (e.g., metal nitride, metal carbide, metal silicide, tungsten nitride, titanium nitride, tungsten silicide, titanium silicide, etc.).

In some example embodiments, the material 62 may comprise, consist essentially of, or consist of semiconductor material (either undoped, or conductively doped); such as, for example, silicon, germanium, semiconductor oxide, etc.

Figure 13:
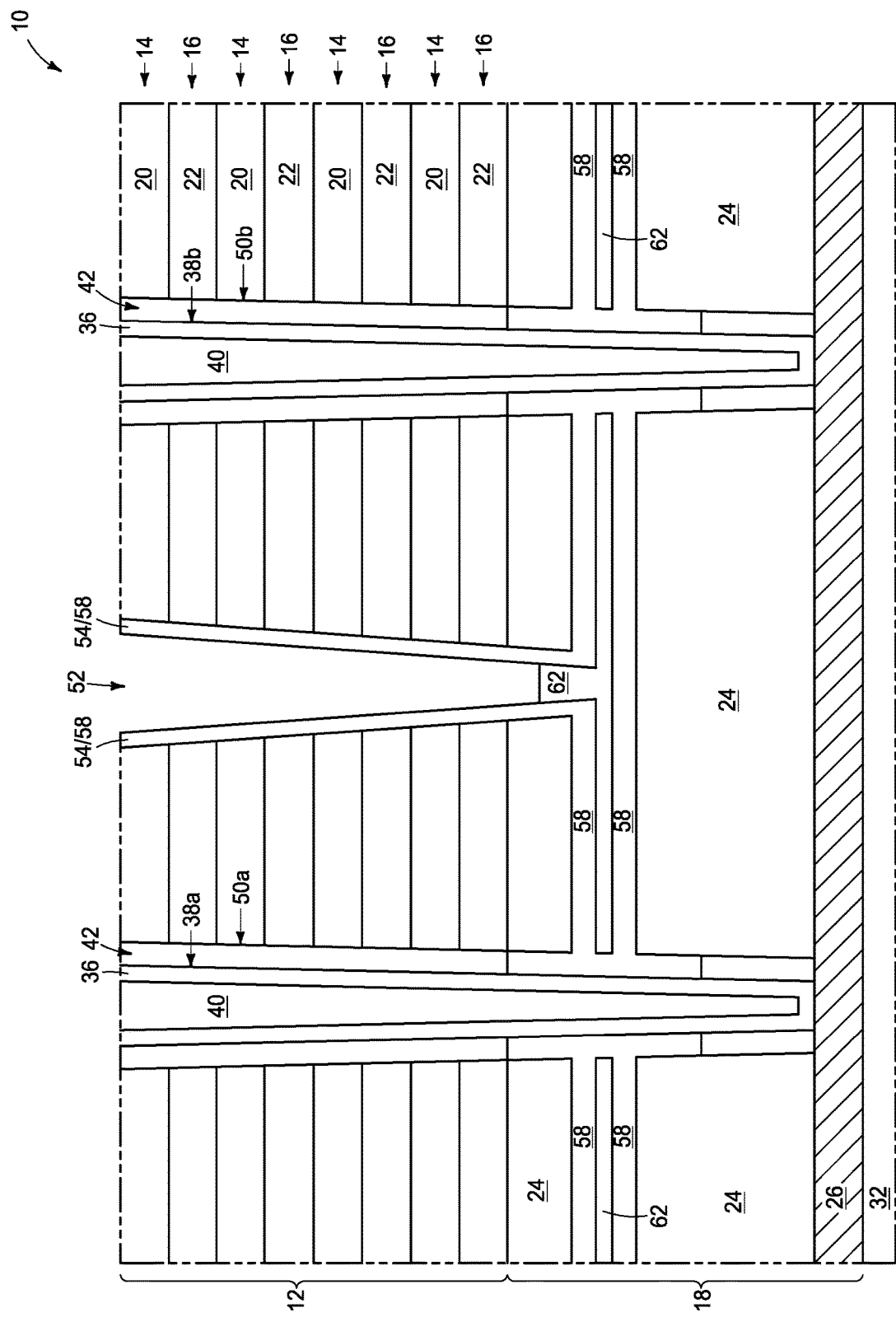
FIG. 13 is a diagrammatic cross-sectional side view of the example integrated assembly of FIG. 6 at an example process stage subsequent to that of FIG. 12.

Referring to FIG. 13, the material 62 is recessed within the third opening 52 (i.e., the slit 52) to a level beneath the lowest of the first levels 16 (i.e., to a level beneath the bottommost of the levels 16 of the stack 12).

Figure 14:
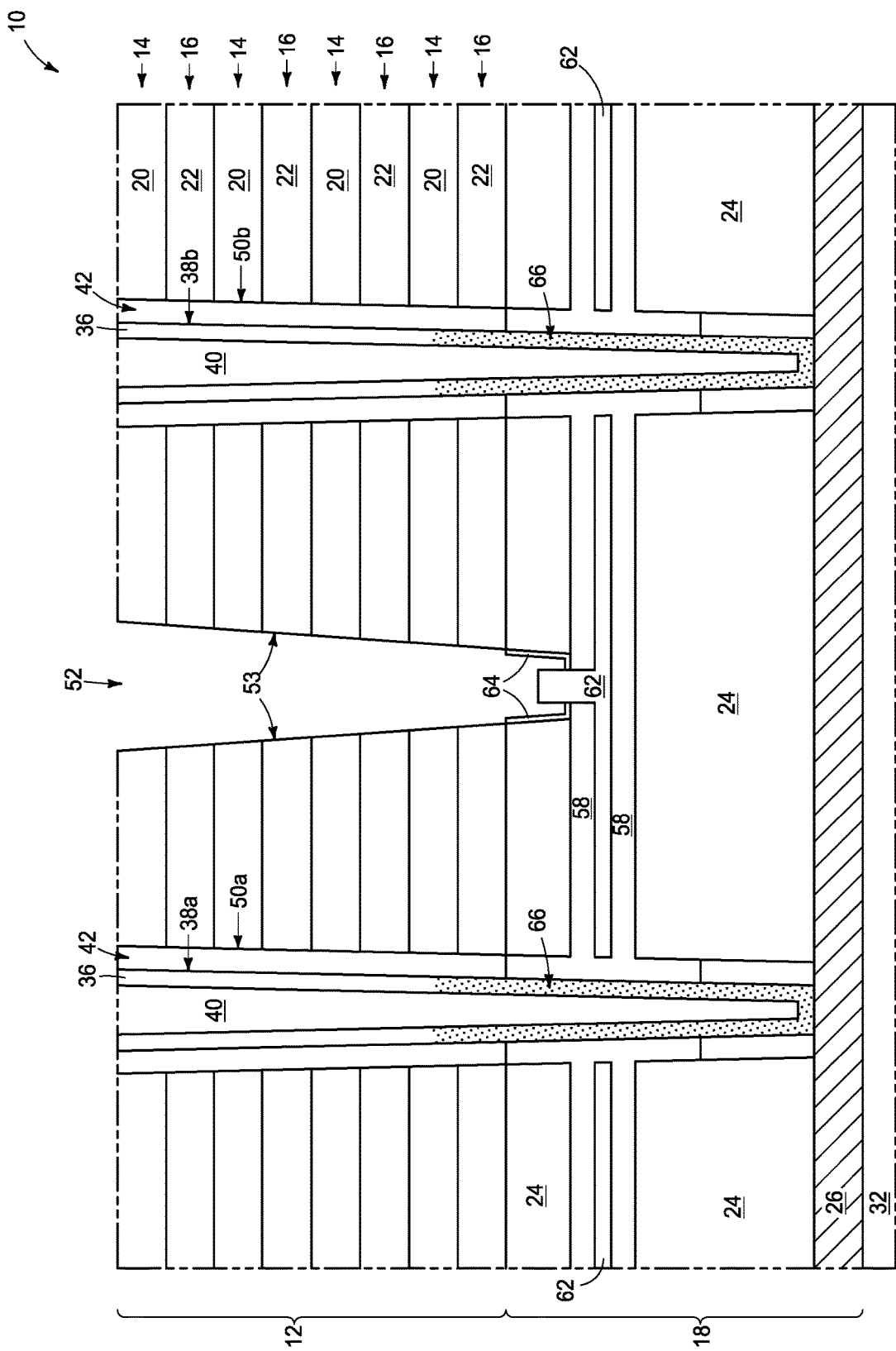
FIG. 14 is a diagrammatic cross-sectional side view of the example integrated assembly of FIG. 6 at an example process stage subsequent to that of FIG. 13.

Referring to FIG. 14, the materials 54/58 are removed from along the sidewalls 53 of the opening (slit) 52, and protective material 64 is formed along the conductively-doped semiconductor material 24 at the bottom of the opening 52. The protective material 64 may protect the conductively-doped semiconductor material 24 (e.g., conductively-doped silicon) from being exposed to a subsequent etch (described below with reference to FIG. 15) which may otherwise undesirably remove the conductively-doped semiconductor material. The protective material 64 may comprise any suitable composition(s); and in some embodiments may comprise, consist essentially of, or consist of silicon dioxide. The protective material 64 may be formed by oxidizing regions of the materials 54/58 (FIG. 13), oxidizing a region of the material 24, and/or by deposition (e.g., atomic layer deposition, chemical vapor deposition, etc.).

Dopant is out-diffused from the conductively-doped semiconductor material 58 into the semiconductor material (channel material) 36 to form the heavily-doped regions 66 within lower portions of the channel-material-pillars 38. Stippling is utilized to indicate the dopant within the heavily-doped regions 66. The doped regions 66 extend upwardly to the lowest of the first levels 14.

The out-diffusion from the doped material 58 into the semiconductor material 36 may be accomplished with any suitable processing, including, for example, suitable thermal processing (e.g., thermal processing at a temperature exceeding about 300° C. for a duration of at least about two minutes).

Figure 15:
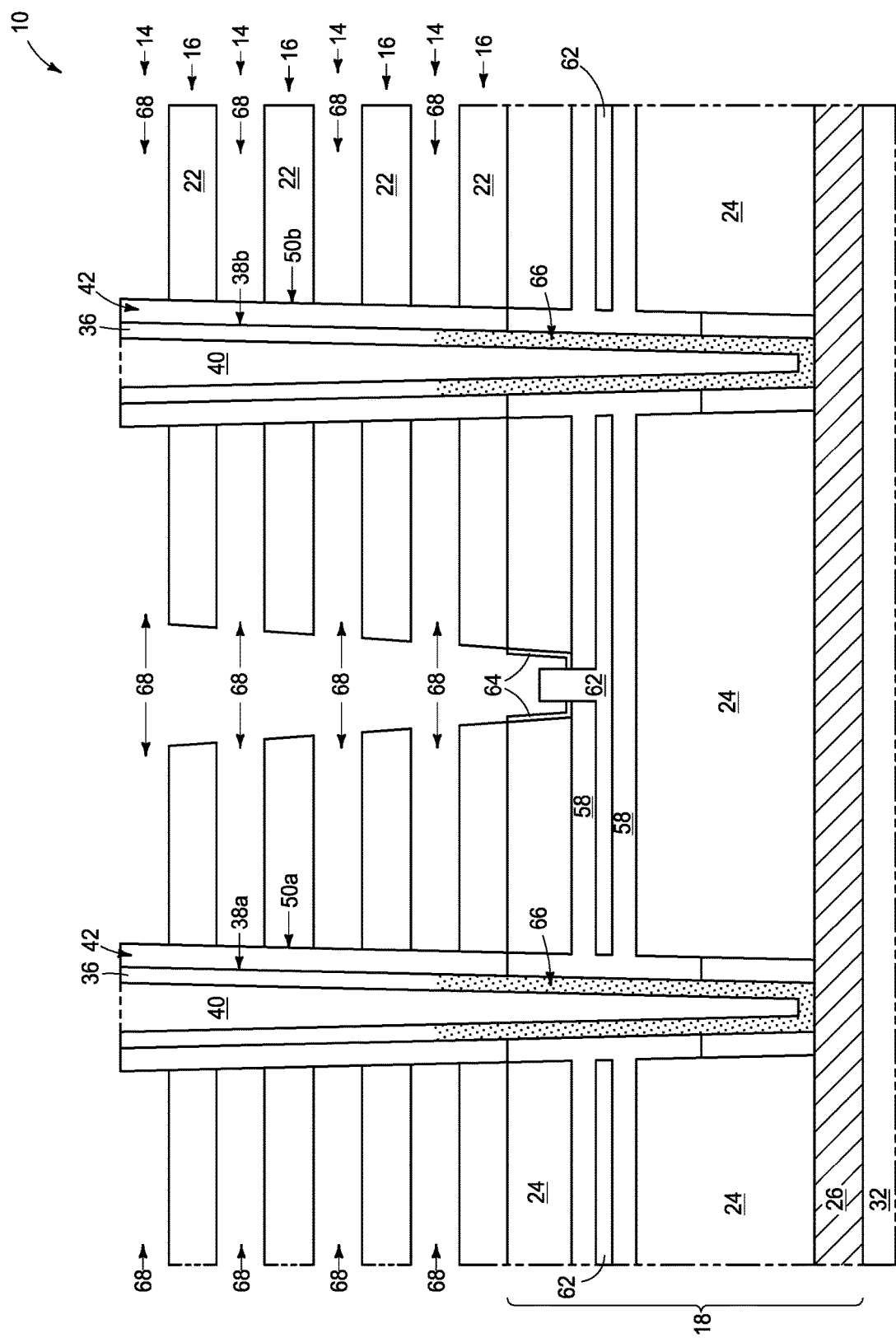
FIG. 15 is a diagrammatic cross-sectional side view of the example integrated assembly of FIG. 6 at an example process stage subsequent to that of FIG. 14.

Referring to FIG. 15, the material 20 (FIG. 14) of the first levels 14 is removed to leave voids 68 along the first levels 16. In some embodiments, the material 20 may comprise silicon nitride, and may be removed with an etch utilizing hot phosphoric acid. The material 64 protects the conductively-doped semiconductor material 24 from being exposed to such hot phosphoric acid.

Figure 16:
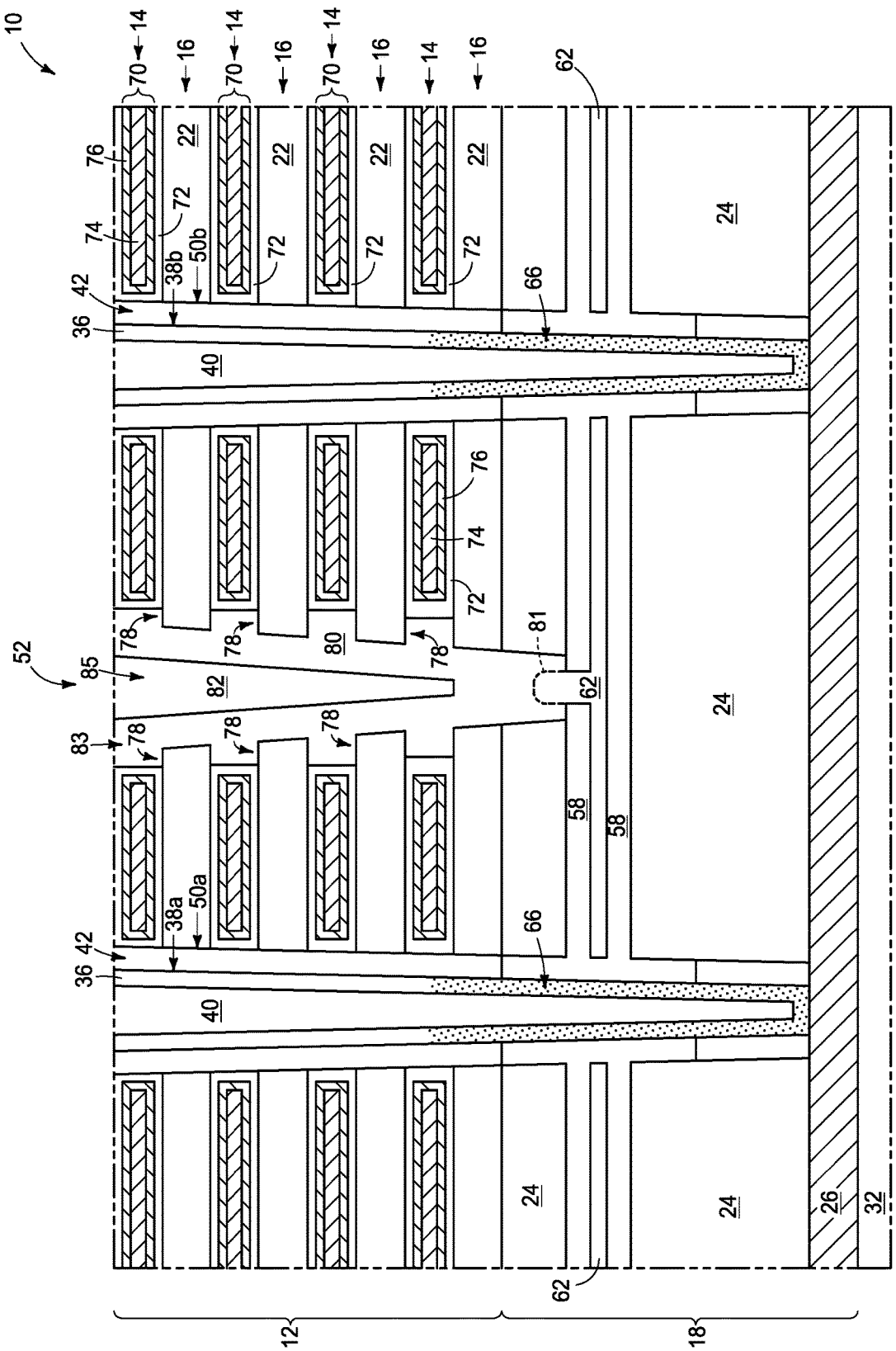
FIG. 16 is a diagrammatic cross-sectional side view of the example integrated assembly of FIG. 6 at an example process stage subsequent to that of FIG. 15.

Referring to FIG. 16, the voids 68 (FIG. 15) are lined with the dielectric-barrier material 72, and are then filled with the conductive material 70. The conductive material 70 may comprise any suitable composition(s); and in the shown embodiment comprises the conductive core material 74 (e.g., tungsten) at least partially surrounded by the conductive liner material 76 (e.g., titanium nitride).

The first levels 14 of FIG. 16 may be considered to be conductive levels, and the stack 12 may be considered to comprise alternating insulative levels 16 and conductive levels 14.

The insulative materials 80 and 82 are formed within the opening (trench, slit) 52. The material 80 may comprise a same composition as the material 62, or may comprise a different composition than the material 62. Accordingly, a dashed line 81 is provided to indicate a possible interface where the materials 62 and 80 join to one another in embodiments in which the materials 62 and 80 comprise different compositions relative to one another. If the materials 62 and 80 comprise a same composition as one another, then such materials will some merge into a single continuous material which extends within the opening 52 and within the source structure 18.

The insulative materials 80 and 82 may comprise any suitable composition(s); and may comprise a same composition as one another, or different compositions. In some embodiments the material 80 may comprise, consist essentially of, or consist of silicon dioxide; and the material 82 may comprise, consist essentially of, or consist of one or more of silicon, silicon nitride, carbon, etc. In some embodiments, the material 80 may be considered to form an outer liner region within the trench (slit) 52, and may be considered to be configured as a trough 83. The material 82 to be considered to be configured as an inner core region 85 within such trough.

In the illustrated embodiment, the material 80 wraps around terminal regions 78 of the insulative levels 16.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a stack of memory cell levels. A pair of channel-material-pillars extend through the stack. A source structure is under the stack. The source structure includes a portion having an upper region, a lower region, and an intermediate region between the upper and lower regions. The upper and lower regions have a same composition and join to one another at edge locations. The intermediate region has a different composition than the upper and lower regions. The edge locations are directly against the channel material of the channel-material-pillars.

Some embodiments include an integrated structure comprising a stack of alternating insulative levels and conductive levels. A source structure is under the stack. A panel extends through the conductive levels. The panel is between a first block region and a second block region. A first channel-material-pillar extends through the stack and is in the first block region. A bottom of the first channel-material-pillar extends into the source structure. A second channel-material-pillar extends through the stack and is in the second block region. A bottom of the second channel-material-pillar extends into the source structure. The source structure comprises a portion having an upper region, a lower region, and an intermediate region between the upper and lower regions. The upper and lower regions comprise a same composition and join to one another at edge locations. The intermediate region comprises a different composition than the upper and lower regions. The edge locations are directly against the channel material of the first and second channel-material-pillars.

Some embodiments include a method of forming an integrated assembly. A construction is formed to comprise a source structure, and to comprise a stack of alternating first and second levels over the source structure. The source structure includes semiconductor material over metal-containing material, and includes a sacrificial-material seam extending laterally within the semiconductor material. First and second openings are formed to extend through the stack, through the semiconductor material and the sacrificial-material seam therein, and to the metal-containing material. First and second pillars are formed within the first and second openings, respectively. The first and second pillars include first and second channel-material-cylinders, respectively, and include cell materials outwardly of the first and second channel-material-cylinders. A third opening is formed between the first and second openings. The third opening extends to the sacrificial-material seam. The sacrificial material of the sacrificial-material seam is removed to form a conduit extending from the first pillar to the second pillar. The cell materials adjacent the conduit are removed to extend the conduit to the first and second channel-material-cylinders. Conductively-doped semiconductor material is formed within the conduit to line the conduit. The conductively-doped semiconductor material is directly against the first and second channel-material-cylinders. A void remains within the lined conduit and is open to the third opening. A first material is formed within the void and the third opening. Dopant is out-diffused from the conductively-doped semiconductor material into the channel material of the first and second channel-material-cylinders. The out-diffused dopant extends upwardly to at least one of the first levels. Conductive material is formed within the first levels.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
   a stack of memory cell levels;
   a conductively doped channel-material-pillar extending through the stack, wherein a portion of the conductively doped channel-material-pillar is more heavily doped than another portion of the conductively doped channel-material-pillar; and
   a source structure under the stack; the source structure comprising a portion having an upper region, a lower region, and an intermediate region between the upper and lower regions; the upper and lower regions joining to one another at edge locations; the intermediate region comprising semiconductor material and being a different composition than the upper and lower regions; the edge locations being directly against the more heavily doped portion of the conductively doped channel-material pillar.

2. The integrated structure of claim 1 wherein the intermediate region has a vertical thickness of less than or equal to about 30 nm.

3. The integrated structure of claim 1 wherein the intermediate region has a vertical thickness of less than or equal to about 10 nm.

4. The integrated structure of claim 1 wherein the memory cell levels of the stack are spaced from one another by intervening levels comprising silicon dioxide.

5. An integrated structure, comprising:
   a stack of memory cell levels;
   a pair of conductively doped channel-material-pillars extending through the stack, the conductively doped channel material pillars having an upper portion and a lower portion, the lower portion being more heavily doped than the upper portion; and
   a source structure under the stack, the source structure comprising a portion having an upper region, a lower region, and an intermediate region between the upper and lower regions, the upper and lower regions joining to one another at edge locations, the intermediate region comprising a conductive material and being a different composition than the upper and lower regions, the edge locations being directly against the channel material of the channel-material-pillars.

6. The integrated structure of claim 5 wherein the intermediate region comprises metal.

7. The integrated structure of claim 5 wherein the upper and lower regions comprise conductively-doped semiconductor material.

8. The integrated structure of claim 5 wherein the upper and lower regions comprise conductively-doped silicon.

9. An integrated structure, comprising:
   a stack of alternating insulative levels and conductive levels;
   a source structure under the stack;
   a panel extending through the conductive levels, the panel being between a first block region and a second block region, the panel comprising an outer liner region configured as a trough, and an inner core region within said trough; the outer liner region comprising a same material as an intermediate region of the source structure and being continuous with the material of the intermediate region;
   a first channel-material-pillar extending through the stack and being in the first block region; a bottom of the first channel-material-pillar extending into the source structure; and
   a second channel-material-pillar extending through the stack and being in the second block region; a bottom of the second channel-material-pillar extending into the source structure.

10. The integrated structure of claim 9 wherein the source structure comprises a portion having an upper region, a lower region, and the intermediate region between the upper and lower regions; the upper and lower regions joining to one another at edge locations; the intermediate region comprising a different composition than the upper and lower regions; the edge locations being directly against the channel material of the first and second channel-material-pillars.

11. The integrated structure of claim 9 wherein the intermediate region comprises semiconductor material.

12. The integrated structure of claim 9 wherein the intermediate region comprises insulative material.

13. The integrated structure of claim 9 wherein the intermediate region comprises conductive material.

14. The integrated structure of claim 9 wherein the intermediate region comprises one or more members of the group consisting of amorphous carbon, silicon dioxide and silicon nitride.

* * * * *